United States Patent
Doyle et al.

(10) Patent No.: US 8,633,513 B2
(45) Date of Patent: Jan. 21, 2014

(54) STRUCTURES AND METHODS FOR REDUCING JUNCTION LEAKAGE IN SEMICONDUCTOR DEVICES

(75) Inventors: Daniel Doyle, Eagle, ID (US); Jeffrey Gleason, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 981 days.

(21) Appl. No.: 12/324,038

(22) Filed: Nov. 26, 2008

(65) Prior Publication Data

US 2010/0127356 A1    May 27, 2010

(51) Int. Cl.
*H01L 31/102* (2006.01)
*H01L 31/105* (2006.01)

(52) U.S. Cl.
USPC ........... 257/184; 257/458; 257/465; 257/466; 257/E31.061

(58) Field of Classification Search
USPC .......... 257/184, 458, 465, 466, E31.061, 210, 257/203, 211, 356, E27.107
See application file for complete search history.

(56) References Cited

U.S. PATENT DOCUMENTS

| | | | |
|---|---|---|---|
| 5,552,616 A * | 9/1996 | Kobayashi | 257/184 |
| 5,955,748 A * | 9/1999 | Nakamura et al. | 257/88 |
| 6,072,217 A | 6/2000 | Burr | |
| 6,307,239 B1 | 10/2001 | Chen et al. | |
| 6,365,939 B1 | 4/2002 | Noguchi | |
| 7,112,466 B2 | 9/2006 | Mann | |
| 7,368,799 B2 * | 5/2008 | Nagaoka | 257/500 |
| 8,148,788 B2 * | 4/2012 | Suzuki et al. | 257/409 |
| 2004/0077121 A1 * | 4/2004 | Maeda et al. | 438/75 |

FOREIGN PATENT DOCUMENTS

TW 401648 B 8/2000

* cited by examiner

*Primary Examiner* — Zandra Smith
*Assistant Examiner* — Tsz Chiu

(57) ABSTRACT

Structures and method for reducing junction leakage in semiconductor devices. The die can include a substrate having a cut edge, a first region of first conductivity type within the substrate and a region of a second conductivity type within the substrate and in contact with the first region forming a junction. At least one semiconductor device is on the substrate. A second region of the first conductivity type is between the plurality of semiconductor devices and the cut edge within the region of the second conductivity type, and extending to the junction. The second region of the first conductivity type can isolate the at least one semiconductor device from leakage pathways created by saw damage at the junction along the cut edge.

14 Claims, 5 Drawing Sheets

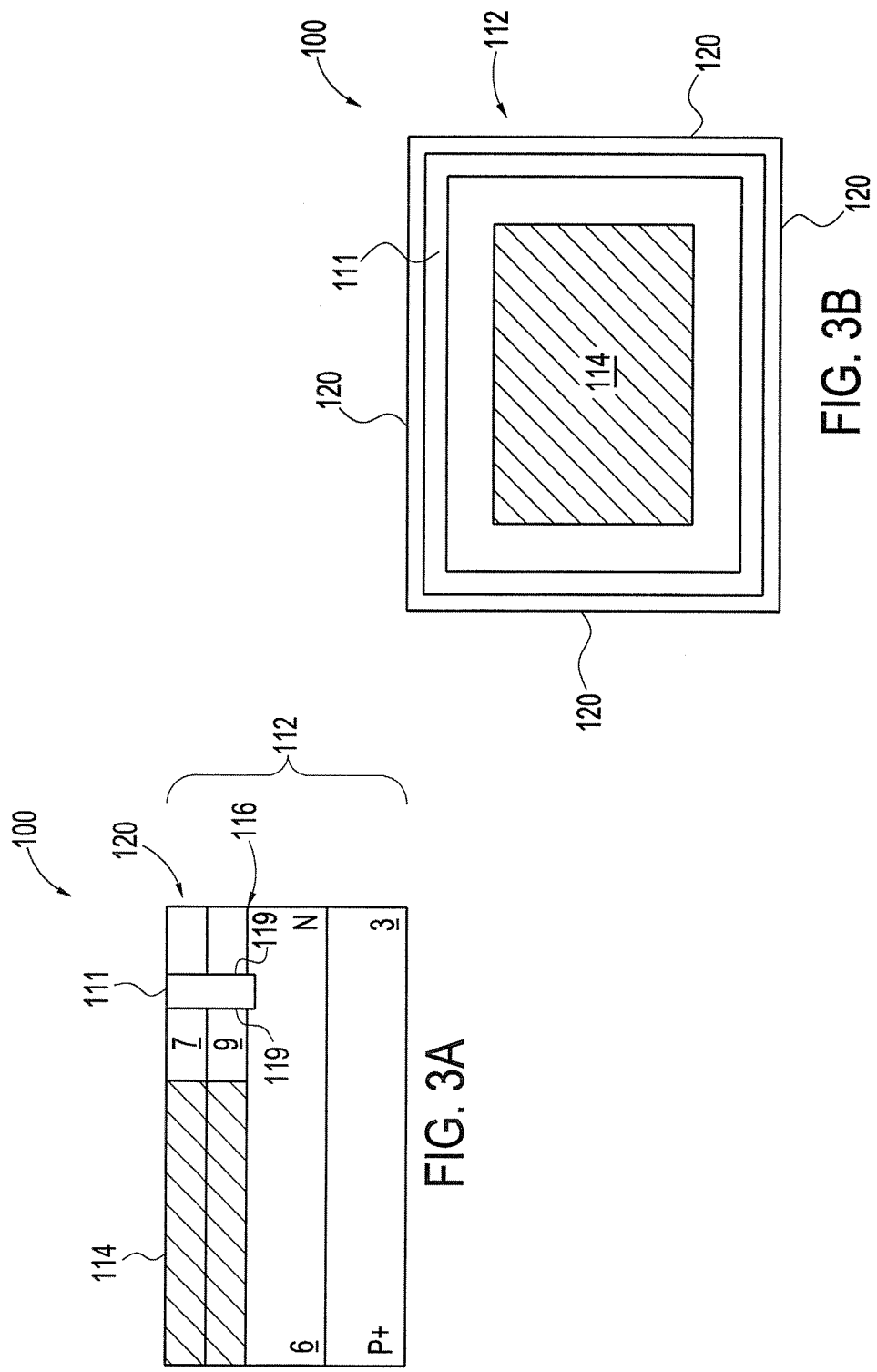

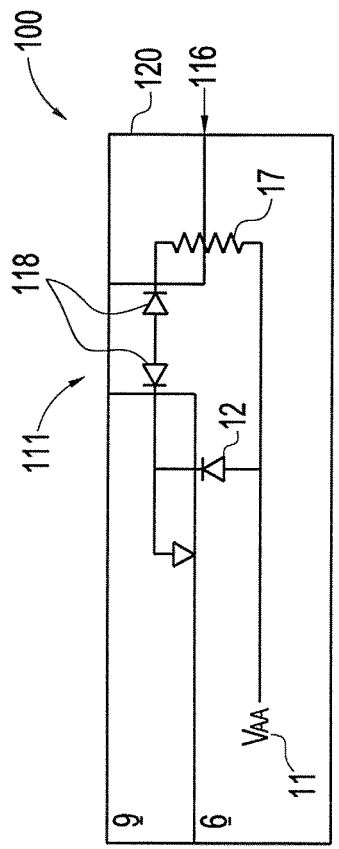
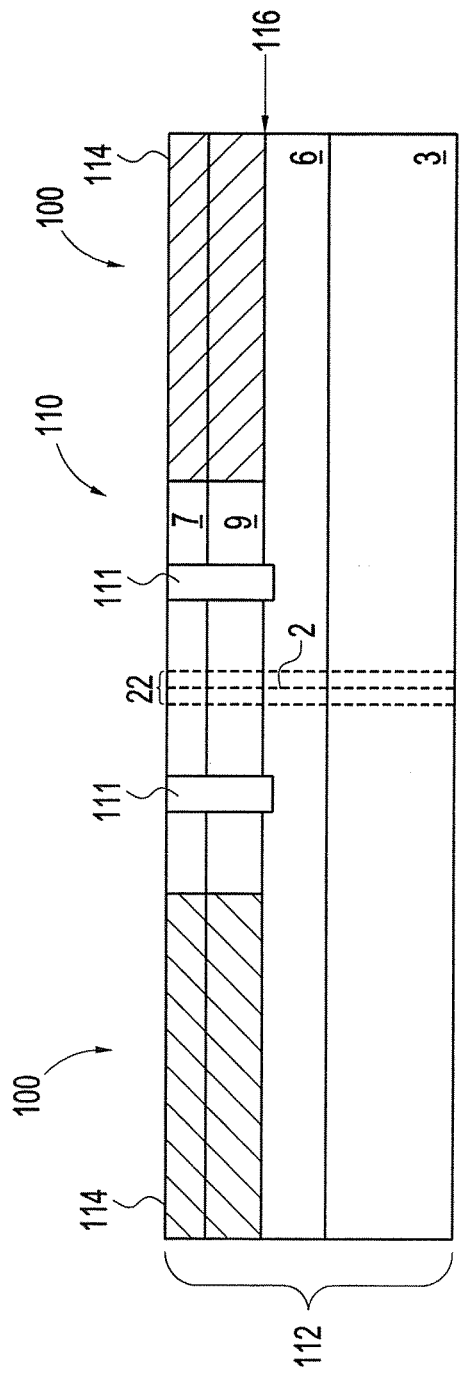
FIG. 3C
FIG. 4

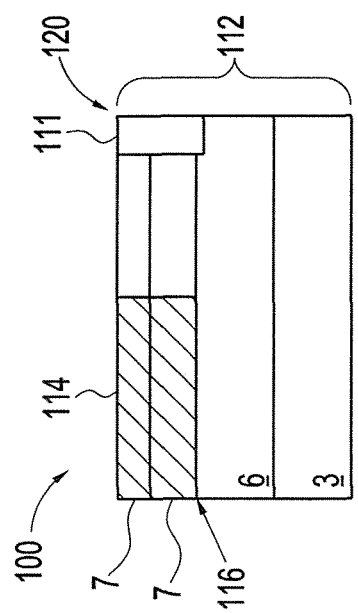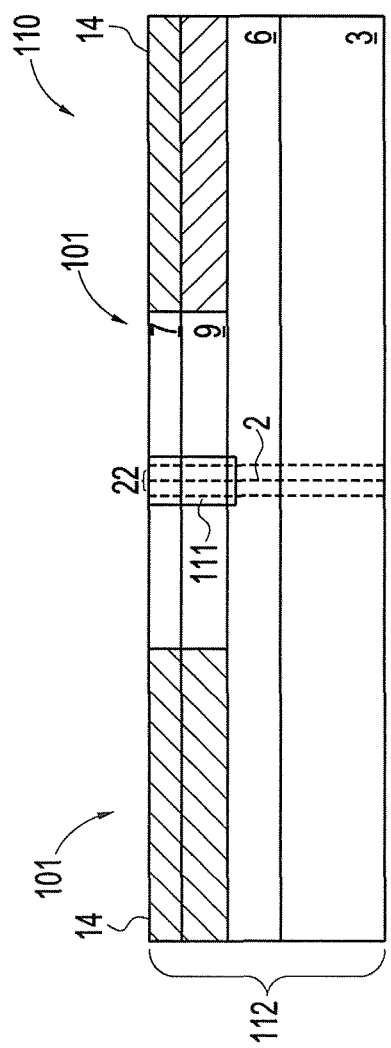

STRUCTURES AND METHODS FOR REDUCING JUNCTION LEAKAGE IN SEMICONDUCTOR DEVICES

FIELD OF THE INVENTION

Disclosed embodiments relate generally to semiconductor circuits, and more particularly to structures and processes for isolating the devices of a semiconductor die from leakage pathways that can occur across a PN junction at an edge of the die.

BACKGROUND

Imager devices are used in digital cameras, wireless devices with picture taking capabilities, and many other applications. Cellular telephones and Personal Digital Assistants (PDAs), for example, are incorporating imager devices for capturing and sending pictures. Imager devices include image sensors that use Charged Coupled Device (CCD) systems, Complementary Metal-Oxide Semiconductor (CMOS) systems, or other solid-state systems.

As shown in FIG. 1A, imager devices may be formed on a wafer 1 that may include one or more PN junctions across the wafer 1. In the FIG. 1A example, wafer 1 includes a silicon substrate 12 with an n-type layer 6 over a p-type layer 3. A p-type layer 9 is over the n-type layer 6 and an n-type layer 7 is over the p-type layer 9. The wafer 1 includes a plurality of die 10 fabricated therein. Each die 10 includes various devices 14. As an example, die 10 may include imaging devices 14.

The wafer 1 is cut at the saw or scribe line 2 to singulate each die 10. When the wafer is cut, damage can occur at the cut edges 13 (FIG. 1B) of the substrate 12. In particular, damage at the PN junction 16 (FIG. 1B) along the cut edge 13 can lead to charge leakage paths across the junction 16.

FIG. 2A is a schematic diagram of the electrical equivalent of a portion of the wafer 1 prior to cutting. The first n-type layer 6 may be tied to a voltage source, $V_{AA}$ and each die 10 includes a diode at its PN junction 16. FIG. 2B is a schematic diagram of the electrical equivalent of a portion of each die 10 after cutting. As shown in FIG. 2B, damage along the cut edge 13 creates leakage pathways 17 that did not previously exist. In some instances, charge leakage through pathways 17 may adversely affect performance of devices 14, e.g., imager devices. Similar problems may exist for other electronic devices and/or circuits fabricated on a semiconductor substrate 12 having a junction between a P and N region at a scribe line.

Embodiments described herein provide structures and methods for preventing charge leakage across P and N junctions at a cut edge of a die.

BRIEF DESCRIPTION OF THE DRAWINGS

FIG. 3A is an embodiment of an imaging die;

FIG. 3B is a top down view of the imaging die of FIG. 3A;

FIG. 3C is a schematic diagram representing the imaging die of FIG. 3A;

FIG. 4 depicts a method of forming the FIG. 3A imaging die;

FIG. 5 is another embodiment of an imaging die; and

FIG. 6 depicts a method of forming the FIG. 5 imaging die.

DETAILED DESCRIPTION

Figure 1A:
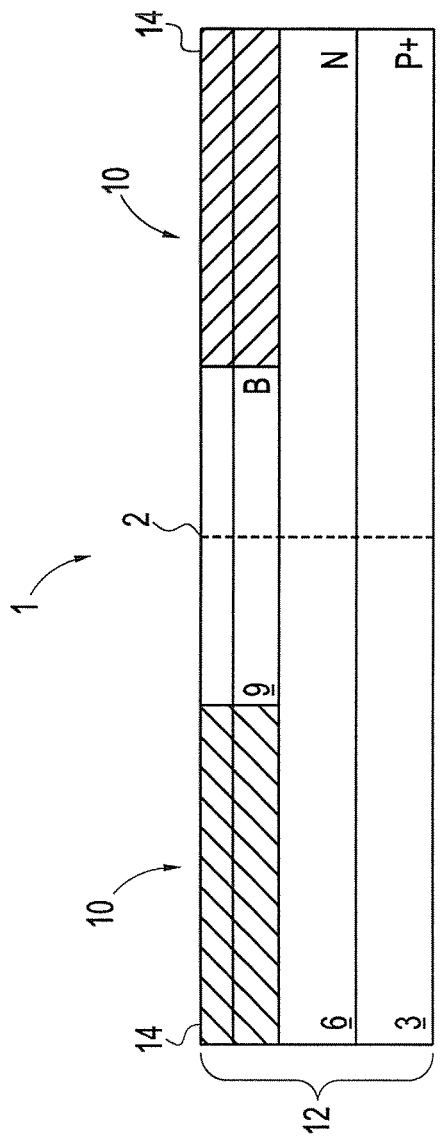
FIG. 1A is a diagram of a wafer including two imaging dice.
Figure 1B:
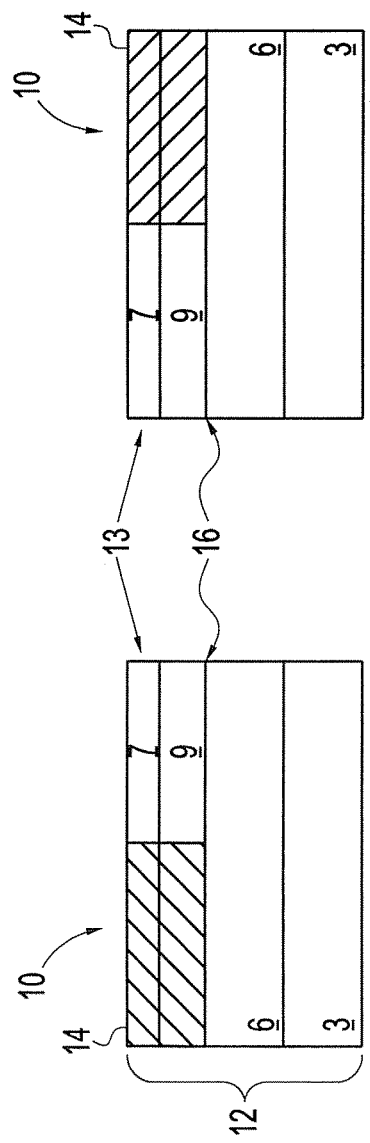
FIG. 1B is a diagram of the two imaging dice subsequent to a cutting operation.
Figure 2A:
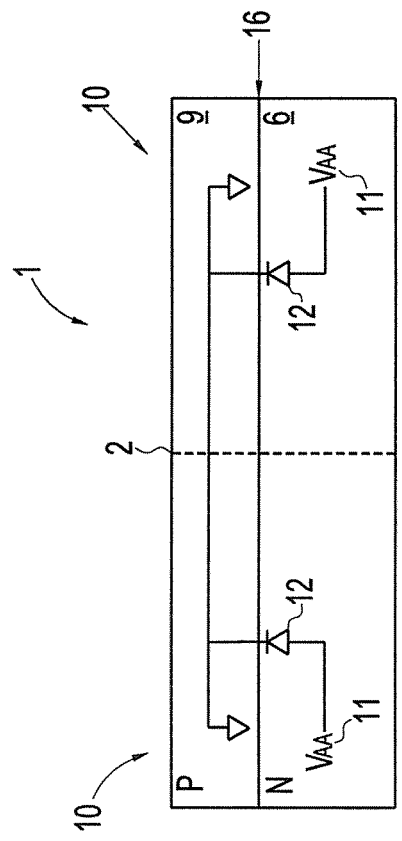
FIG. 2A is a schematic diagram of a portion of the wafer of FIG. 1A.
Figure 2B:
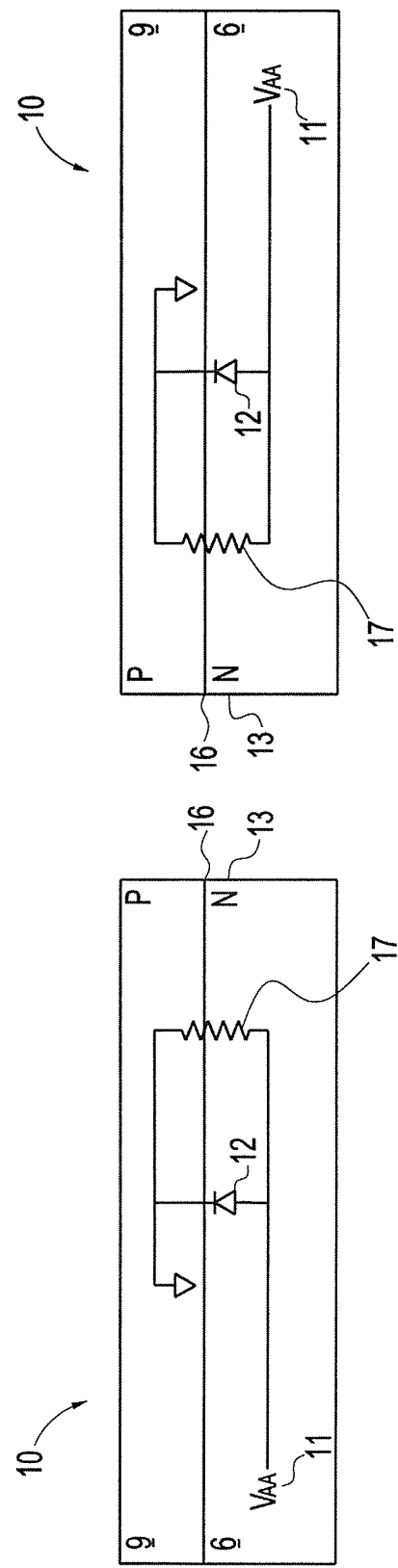
FIG. 2B is a schematic diagram of a portion of the wafer of FIG. 1A subsequent to a cutting operation.

In the following detailed description, reference is made to the accompanying drawings which form a part hereof, and in which are shown by way of illustration specific embodiments that may be practiced. It should be understood that like reference numbers represent like elements throughout the drawings. These example embodiments are described in sufficient detail to enable those skilled in the art to practice them. It is to be understood that other embodiments may be utilized, and that structural, material, and electrical changes may be made, only some of which are discussed in detail below. Although embodiments described herein related to substrates including imager dice, they are not so limited and are related to any substrate having dice where a cut to singulate the dice passes through a PN or NP junction of the substrate.

Structures for a semiconductor die and method of forming the same are provided. The die includes semiconductor devices on a substrate having a PN junction and a cut edge. A doped barrier region is formed between the cut edge and the semiconductor devices to isolate the devices from leakage pathways that can occur across the PN or NP junction at the cut edge.

FIG. 3A depicts a portion of a semiconductor die 100 according to an embodiment. The die includes a substrate 112 that has a heavily doped p-type region 3. Over the p-type region 3 is an n-type region 6. Over the n-type region 6 is a p-type (P+) region 9 and over p-type region 9 is another n-type region 7. Although the substrate 112 is described as including regions 3, 6, 9 and 7, the substrate 112 could be any type of semiconductor substrate having one or more PN or NP junctions.

The die 100 includes one or more semiconductor devices 114, which may include an imager device 114 or other electronic devices or circuits. Alternatively, the devices 114 could be a solar cell, other optoelectronic device or other semiconductor device.

The edge 120 of die 100 is the edge along which the die 100 is cut when singulated from a wafer (not shown). Accordingly, edge 120 can include damage caused by the cut operation, for example, contamination or dislocations crossing the PN or NP junctions 116. This damage can lead to leakage pathways across the junction 116. To electrically isolate any leakage pathways at junction 116 from the devices 114, a barrier region 111 is included in the illustrated embodiment.

Barrier region 111 in the illustrated embodiment is an n-type doped region that extends from the top, or first, surface of the substrate 112 to or below the junction 116. FIG. 3B is a top down view of the die 100 of FIG. 3A. As shown in FIG. 3B, barrier region 111 substantially surrounds the device 114 and is located between the cut edge 120 and the device 114 and spaced from the cut edge 120. Barrier region 111 extends substantially around the full length of the cut edge 120.

FIG. 3C is a schematic diagram of the electrical equivalent of the die 100 of FIG. 3A. Layer 6 is tied to a voltage source, $V_{AA}$ and the die 100 includes a diode 12 at the PN junction 116. The barrier region 111 creates two additional diodes 118 at the PN junctions 119 (FIG. 3A) between barrier region 111 and region 6. The diodes 118 will prevent current from traveling through p-type region 9 and to the devices 114. Thus, the leakage pathway 117 is isolated from the devices 114.

Alternatively, where the conductivity types of the substrate 112 regions 6 and 9 are reversed, the conductivity type of the barrier region 111 could also be reversed. For example, in the case that region 6 is a p-type region and region 9 is an n-type region, the barrier region 111 could be of a p-type conductivity.

FIG. 4 depicts a method of forming the example of the die 100 of FIG. 3A. A wafer 110 is provided. The wafer 110 can be a silicon or other semiconductor wafer. The die includes a substrate 112 that has a heavily doped p-type (P+) region 3. The heavily doped p-type region 3 can be formed by any known method.

Over the p-type region 3 is an n-type region 6. Over the n-type region 6 is a p-type region 9 and over the p-type region 9 is an n-type region 7. Each of the regions 6, 9 and 7 can be formed by growing epitaxial layers of silicon over the p-type region 9. Additionally, known doping techniques can be used to dope each of the regions 6, 9 and 7 to the respective conductivity types.

The die 100 includes one or more semiconductor devices 114. In the illustrated die 100, the devices 114 may include an imager device as an example of a device or circuit contained on die 100.

The barrier regions 111 are formed as n-type regions using known doping techniques. Each barrier region is formed from a top, or first, surface of the substrate 112 to or below the PN junction 116. Further, each barrier region 111 is formed to substantially surround the devices 114 as depicted in FIG. 3B.

Prior to singulation, streets 22 are located between fabricated dice to define locations for a cut line 2 is along the wafer 110 to define each die 100. The wafer is then cut at the cut line 2 to form a plurality of dice of FIG. 3A.

FIG. 5 depicts a die 101 according to another embodiment. The die 101 of FIG. 5 is the same as the die 100 of FIG. 3A, except that the barrier region 111 is between the devices 114 and the cut edge 120 and also at the cut edge 120 after singulation. Barrier region 111 extends substantially along the full length of the cut edge 120. As in the FIG. 3A embodiment, the barrier region 111 serves to isolate the devices 114 from any leakage pathway across the junction 116 at the cut edge 120.

FIG. 6 depicts a method of forming the die 101 of FIG. 5. The method of forming the die 101 is the same as the method for forming the die 100 (as described above in connection with FIG. 4), except that barrier region 111 is formed between the devices 114 and the cut edge 120 and at the cut line 2. The barrier region 111 is formed such that subsequent to a cutting operation to singulate the dice 101, a portion of the barrier region 111 is included on each cut edge 170 of each die 101.

While disclosed embodiments have been described in detail, it should be readily understood that the claimed invention is not limited to the disclosed embodiments or to use with imagers. Rather the disclosed embodiments can be modified to incorporate any number of variations, alterations, substitutions or equivalent arrangements not heretofore described.

What is claimed as new and desired to be protected by Letters Patent of the United States is:

1. A semiconductor die comprising:
   a substrate having a cut edge;
   a first region of a first conductivity type within the substrate;
   a region of a second conductivity type within the substrate and in contact with the first region forming a junction;
   at least one semiconductor device formed on the substrate; and
   a second region of the first conductivity type, wherein the junction includes a functional portion and a peripheral portion, wherein the second region of the first conductivity type separates the functional and peripheral portions, wherein the functional portion extends from the at least one semiconductor device to the second region of the first conductivity type, wherein the peripheral portion extends from the second region of the first conductivity type to the cut edge, and wherein the second region of the first conductivity type electrically isolates the functional portion of the junction from the cut edge.

2. The semiconductor die of claim 1, wherein the first region of the first conductivity type is connected to a voltage source terminal.

3. The semiconductor die of claim 1, wherein the at least one semiconductor device comprises an imager device.

4. The semiconductor die of claim 1, wherein second region of the first conductivity type substantially surrounds the at least one semiconductor device.

5. The semiconductor die of claim 1, wherein second region of the first conductivity type extends substantially along a full length of the cut edge.

6. The semiconductor die of claim 1, wherein the region of the second conductivity type is formed between the first region of the first conductivity type and a third region of the first conductivity type, and wherein the region of the second conductivity type includes at least a portion of the at least one semiconductor device.

7. A semiconductor wafer comprising:
   a substrate;
   a first semiconductor device on the substrate;
   a second semiconductor device on the substrate;
   a street for defining a cut line between the first and second semiconductor devices;
   a first region of a first conductivity type within the substrate;
   a region of a second conductivity type within the substrate and in contact with the first region forming a junction; and
   a plurality of additional regions of the first conductivity type, wherein the junction includes first, second and third portions, wherein the first portion extends from the first semiconductor device to a first one of the additional regions, wherein the second portion extends from the first one of the additional regions to a second one of the additional regions through the street, and wherein the third portion extends from the second semiconductor device to the second one of the additional regions.

8. The semiconductor wafer of claim 7, wherein the at least one second region of the first conductivity type substantially surrounds at least one of the first and second semiconductor devices.

9. The semiconductor wafer of claim 7, wherein the first one of the additional regions of the first conductivity type is located between the cut line and the first semiconductor device, and the second one of the additional regions of the first conductivity type is located between the cut line and the second semiconductor device.

10. A semiconductor die comprising:
    a substrate having a cut edge;
    a region of a first conductivity type within the substrate;
    a region of a second conductivity type within the substrate and in contact with and above the first region forming a p-n junction;
    at least one semiconductor device formed on the substrate; and
    a barrier region of the first conductivity type, wherein the barrier region is between the region of the second conductivity type and the cut edge, wherein the barrier region contacts both the region of the second conductivity type and the region of the first conductivity type, and wherein the barrier region electrically isolates a functional portion of the junction from the cut edge.

11. The semiconductor die of claim 10, wherein the region of the first conductivity type is connected to a voltage source terminal.

12. The semiconductor die of claim 11, wherein the at least one semiconductor device comprises an imager device.

13. The semiconductor die of claim 12, wherein barrier region of the first conductivity type substantially surrounds the at least one semiconductor device.

14. The semiconductor die of claim 13, further comprising an additional region of the first conductivity type over the region of the second conductivity type, wherein the barrier region contacts the additional region.

* * * * *